United States Patent
Venkatadri et al.

(10) Patent No.: US 12,002,838 B2
(45) Date of Patent: Jun. 4, 2024

(54) SHIELDED INTEGRATED DEVICE PACKAGES

(71) Applicant: Analog Devices, Inc., Norwood, MA (US)

(72) Inventors: Vikram Venkatadri, Ayer, MA (US); Mark Downey, Bolton, MA (US); Santosh Anil Kudtarkar, Ayer, MA (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/705,105

(22) Filed: Dec. 5, 2019

(65) Prior Publication Data
US 2020/0185450 A1   Jun. 11, 2020

Related U.S. Application Data

(60) Provisional application No. 62/776,340, filed on Dec. 6, 2018.

(51) Int. Cl.
*H01L 27/146* (2006.01)
*G01T 1/24* (2006.01)
(Continued)

(52) U.S. Cl.
CPC ........ *H01L 27/14661* (2013.01); *G01T 1/244* (2013.01); *H01L 23/552* (2013.01);
(Continued)

(58) Field of Classification Search
CPC ........ H01L 27/14661; H01L 27/14659; H01L 27/14618; H01L 27/14634;
(Continued)

(56) References Cited

U.S. PATENT DOCUMENTS 3,553,030 A   1/1971  Lebrun
4,883,967 A   11/1989 Tsutsui et al.
(Continued)

FOREIGN PATENT DOCUMENTS

CN   109346539 A   2/2019
EP   1852716 A3   11/2007
(Continued)

OTHER PUBLICATIONS

International Search Report issued in application No. PCT/US2019/064770 dated Mar. 17, 2020.
(Continued)

*Primary Examiner* — Bitew A Dinke
(74) *Attorney, Agent, or Firm* — Knobbe, Martens, Olson & Bear, LLP

(57) ABSTRACT

An integrated device package is disclosed. The integrated device package can include a package substrate having a plurality of contact pads on a first side of the package substrate, the plurality of contact pads configured to electrically connect to a sensor assembly. The package can include a radiation shield attached to a second side of the package substrate by way of a first adhesive, the first side opposite the second side. The package can include an integrated device die attached to the radiation shield by way of a second adhesive. The integrated device die can comprise sensitive active electronic circuitry in a sensitive active region of the integrated device die. A molding compound can be disposed over the integrated device die and the radiation shield.

20 Claims, 11 Drawing Sheets

(51) Int. Cl.
*H01L 23/00* (2006.01)
*H01L 23/552* (2006.01)

(52) U.S. Cl.
CPC .............. *H01L 24/29* (2013.01); *H01L 24/32* (2013.01); *H01L 27/14618* (2013.01); *H01L 27/14623* (2013.01); *H01L 27/14634* (2013.01); *H01L 27/14636* (2013.01); *H01L 27/14659* (2013.01); *H01L 2224/29083* (2013.01); *H01L 2224/32227* (2013.01); *H01L 2924/3025* (2013.01)

(58) Field of Classification Search
CPC ......... H01L 27/14636; H01L 27/14623; H01L 23/552; H01L 2924/3025; H01L 2224/32227; H01L 2224/29083; H01L 24/29; H01L 24/32; G01T 1/244
See application file for complete search history.

(56) References Cited

U.S. PATENT DOCUMENTS

| | | | |
|---|---|---|---|
| 5,487,098 A | 1/1996 | Dobbs et al. | |
| 5,528,043 A | 6/1996 | Spivey et al. | |
| 5,801,385 A | 9/1998 | Endo et al. | |
| 5,889,313 A | 3/1999 | Parker | |
| 6,300,679 B1 | 10/2001 | Mukerji et al. | |
| 6,323,891 B1 | 11/2001 | Kitani et al. | |
| 6,396,898 B1 | 5/2002 | Saito et al. | |
| 6,426,991 B1 | 7/2002 | Mattson et al. | |
| 6,476,417 B2 | 11/2002 | Honda et al. | |
| 6,510,195 B1 | 1/2003 | Chappo et al. | |
| 6,573,506 B2 | 6/2003 | Sato et al. | |
| 6,601,947 B1 | 8/2003 | Sato et al. | |
| 6,667,480 B2 | 12/2003 | Kajiwara et al. | |
| 7,067,817 B2 | 6/2006 | Suganuma et al. | |
| 7,148,084 B2 | 12/2006 | Strobel et al. | |
| 7,189,971 B2 | 3/2007 | Spartiotis | |
| 7,193,218 B2 | 3/2007 | Nagano | |
| 7,202,482 B2 | 4/2007 | Yokoi et al. | |
| 7,339,176 B2 | 3/2008 | El-Hanany et al. | |
| 7,358,501 B2 | 4/2008 | Danzer et al. | |
| 7,382,043 B2 | 6/2008 | Longden et al. | |
| 7,468,514 B1 | 12/2008 | Suzuki et al. | |
| 7,504,637 B2 | 3/2009 | Thorne | |
| 7,504,701 B2 | 3/2009 | Moribayashi et al. | |
| 7,544,947 B2 | 6/2009 | Kerwin et al. | |
| 7,696,610 B2 | 4/2010 | Patterson | |
| 8,000,437 B2 | 8/2011 | Kotooka | |
| 8,829,454 B2 | 9/2014 | Bolognia | |
| 8,859,975 B2 | 10/2014 | Tokura et al. | |
| 8,866,098 B2 | 10/2014 | Hayatsu et al. | |
| 9,035,457 B2 | 5/2015 | Lin et al. | |
| 9,116,022 B2 | 8/2015 | Bolognia | |
| 9,171,878 B2 | 10/2015 | Yaoi et al. | |
| 9,324,687 B1 | 4/2016 | Kelkar et al. | |
| 9,337,233 B1* | 5/2016 | Palit ................ | H01L 27/14663 |
| 9,466,594 B2 | 10/2016 | Bolognia | |
| 9,583,472 B2 | 2/2017 | Chung et al. | |
| 9,835,733 B2 | 12/2017 | Ying | |
| 9,837,352 B2 | 12/2017 | Chang et al. | |
| 10,276,525 B2 | 4/2019 | Hsiao et al. | |
| 10,340,302 B2 | 7/2019 | Bolognia et al. | |
| 2002/0011572 A1 | 1/2002 | Kajiwara et al. | |
| 2002/0070343 A1 | 6/2002 | Hoffman | |
| 2002/0079445 A1 | 6/2002 | Hantschel et al. | |
| 2002/0148968 A1 | 10/2002 | Der Haar | |
| 2002/0153492 A1 | 10/2002 | Sekine et al. | |
| 2003/0010924 A1 | 1/2003 | El-Hanany et al. | |
| 2003/0097875 A1 | 5/2003 | Lentz et al. | |
| 2004/0223583 A1 | 11/2004 | Tsujii | |
| 2005/0029463 A1 | 2/2005 | Kaemmerer | |
| 2005/0067178 A1 | 3/2005 | Pearson et al. | |
| 2005/0285973 A1 | 12/2005 | Singh et al. | |
| 2006/0223227 A1 | 10/2006 | Kubota et al. | |
| 2007/0045556 A1 | 3/2007 | Watanabe et al. | |
| 2007/0066139 A1 | 3/2007 | Roeper et al. | |
| 2007/0096249 A1 | 5/2007 | Roeper et al. | |
| 2007/0152148 A1 | 7/2007 | Chao et al. | |
| 2007/0183184 A1 | 8/2007 | Nakamura et al. | |
| 2007/0221859 A1 | 9/2007 | Nakata | |
| 2007/0235865 A1 | 10/2007 | Bauer et al. | |
| 2008/0011959 A1 | 1/2008 | Thorne | |
| 2008/0100732 A1 | 5/2008 | Minamio et al. | |
| 2008/0112150 A1* | 5/2008 | Jones ................ | H01L 25/0657 |
| | | | 174/388 |
| 2008/0197480 A1 | 8/2008 | Yang et al. | |
| 2008/0283764 A1 | 11/2008 | Kerwin | |
| 2009/0084971 A1 | 4/2009 | Ohta et al. | |
| 2009/0121146 A1* | 5/2009 | Luhta ................ | H01L 27/14661 |
| | | | 250/370.11 |
| 2010/0078565 A1 | 4/2010 | Tsubota et al. | |
| 2010/0200760 A1* | 8/2010 | Baeumer ............ | H01L 27/1446 |
| | | | 250/366 |
| 2010/0224785 A1 | 9/2010 | Chiyoma et al. | |
| 2010/0276572 A1* | 11/2010 | Iwabuchi ................ | H01L 25/18 |
| | | | 250/208.1 |
| 2011/0024888 A1 | 2/2011 | Pagaila et al. | |
| 2011/0133939 A1 | 6/2011 | Ranganathan et al. | |
| 2011/0156248 A1 | 6/2011 | Matsuki | |
| 2011/0272588 A1 | 11/2011 | Jadrich et al. | |
| 2011/0304015 A1* | 12/2011 | Kim ..................... | H01L 25/105 |
| | | | 257/532 |
| 2012/0097857 A1 | 4/2012 | Hayatsu et al. | |
| 2012/0119388 A1 | 5/2012 | Cho et al. | |
| 2012/0126381 A1 | 5/2012 | Uenda et al. | |
| 2013/0221468 A1 | 8/2013 | Bolognia | |
| 2013/0266122 A1 | 10/2013 | Patil et al. | |
| 2014/0015081 A1* | 1/2014 | Luhta ................ | H01L 31/02322 |
| | | | 257/428 |
| 2014/0027637 A1 | 1/2014 | Watano | |
| 2014/0159226 A1 | 6/2014 | Bologna | |
| 2014/0270057 A1* | 9/2014 | Bartolome ........... | G01N 23/046 |
| | | | 378/19 |
| 2014/0291819 A1 | 10/2014 | Barth | |
| 2014/0321601 A1* | 10/2014 | Koduri ................ | A61B 8/0858 |
| | | | 378/4 |
| 2015/0061043 A1 | 3/2015 | Bolognia | |
| 2015/0340327 A1 | 11/2015 | Uzoh | |
| 2016/0079219 A1 | 3/2016 | Hosomi | |
| 2016/0093796 A1* | 3/2016 | Arai ...................... | H01L 23/552 |
| | | | 257/422 |
| 2016/0154124 A1* | 6/2016 | Luhta ................ | H01L 27/14618 |
| | | | 250/361 R |
| 2016/0293575 A1 | 10/2016 | Liu et al. | |
| 2016/0320495 A1* | 11/2016 | Ying ..................... | G01T 1/2018 |
| 2016/0322300 A1 | 11/2016 | Song et al. | |
| 2016/0322418 A1 | 11/2016 | Leblans et al. | |
| 2016/0322562 A1* | 11/2016 | Jang ..................... | H01L 23/051 |
| 2017/0025463 A1 | 1/2017 | Bolognia et al. | |
| 2017/0084521 A1* | 3/2017 | Chang .................... | H01L 24/84 |
| 2017/0104149 A1 | 4/2017 | Ugge | |
| 2017/0188458 A1 | 6/2017 | Hsieh et al. | |
| 2017/0230597 A1* | 8/2017 | Fahim .................... | H04N 5/379 |
| 2017/0258422 A1 | 9/2017 | Kim et al. | |
| 2017/0287849 A1* | 10/2017 | Takaku ................ | H01L 21/56 |
| 2017/0307766 A1* | 10/2017 | Abenaim ............... | G01T 1/2018 |
| 2018/0019035 A1 | 1/2018 | Baturin | |
| 2018/0033774 A1 | 2/2018 | Kuo et al. | |
| 2018/0100937 A1* | 4/2018 | Luhta .................... | H05K 1/0218 |
| 2018/0102470 A1* | 4/2018 | Das ........................ | H01L 25/50 |
| 2018/0210096 A1* | 7/2018 | Luhta .................. | H01L 27/14618 |
| 2018/0294255 A1 | 10/2018 | Liu | |
| 2019/0067034 A1* | 2/2019 | Pachamuthu ......... | H01L 23/481 |
| 2019/0088636 A1 | 3/2019 | Gamini | |
| 2019/0189300 A1 | 6/2019 | Rauth | |
| 2019/0339402 A1* | 11/2019 | Crestani .............. | G01T 1/243 |
| 2019/0363226 A1* | 11/2019 | Musashi ................ | H01L 33/58 |

(56) References Cited

U.S. PATENT DOCUMENTS

| | | | |
|---|---|---|---|
| 2020/0185346 A1* | 6/2020 | Venkatadri | ............ H01L 23/552 |
| 2020/0185646 A1 | 6/2020 | Kim | |

FOREIGN PATENT DOCUMENTS

| | | |
|---|---|---|
| JP | 10-284633 | 10/1998 |
| JP | 2001-099942 | 4/2001 |
| JP | 2002-022841 | 1/2002 |
| JP | 2003-332515 | 11/2003 |
| JP | 2006-052978 | 2/2006 |
| JP | 2006-351765 | 12/2006 |
| JP | 2008-171881 | 7/2008 |
| JP | 2008-268038 | 11/2008 |
| JP | 2009-189384 | 8/2009 |
| JP | 2012-088152 | 5/2012 |
| WO | WO 2007/039840 | 4/2007 |
| WO | WO 2009/066556 | 5/2009 |
| WO | WO 2010/137396 | 2/2010 |
| WO | WO 2015/138359 A1 | 9/2015 |
| WO | WO 2015/179764 A1 | 11/2015 |
| WO | WO 2016/048367 A1 | 3/2016 |
| WO | WO 2018/182754 A1 | 10/2018 |

OTHER PUBLICATIONS

Written Opinion issued in application No. PCT/US2019/064770 dated Mar. 17, 2020.
Bellenger et al., "Silicon interposers with integrated passive devices: Ultra-miniaturized solution using 2.5D packaging platform," IPDiA, accessed Sep. 10, 2019.
Cesmeli, Erdogan Ph.D., "V-Res—Detecting the Difference in Volume CT," GE Healthcare Publication.
Extended Search Report dated May 26, 2015 in European Application No. 13755853.2 filed Aug. 4, 2014 in 6 pages.
International Search Report and Written Opinion of the International Search Authority in PCT/US2013/027643, dated Jun. 24, 2013, 12 pages.
Maloney, Lawrence D., "Close Cooperation Among a Global Engineering Team Led to the Success of the Lightspeed VCT Medical Scanner," Test & Measurement World Aug. 2005.
"Micromachining—Function in a Small Package," SSC00-X-3, to Fox et al., p. 107, available at http://digitalcommons.usu.edu/cgi/viewcontent.cgi?article=2100&content=smallsat.
Office Action in U.S. Appl. No. 13/405,594 dated Aug. 6, 2013.
Office Action in U.S. Appl. No. 13/405,594 dated Dec. 14, 2013.
Office Action in U.S. Appl. No. 14/478,810 dated Oct. 29, 2015 in 15 pages.
Office Action received in U.S. Appl. No. 14/478,810 dated Feb. 23, 2016 in 13 pages.
Office Action received in U.S. Appl. No. 13/708,727 dated Oct. 30, 2014 in 12 pages.
Office Action received in U.S. Appl. No. 14/805,835 dated Oct. 20, 2016 in 15 pages.
Office Action received in U.S. Appl. No. 14/805,835 dated May 1, 2017 in 13 pages.
Office Action received in U.S. Appl. No. 14/805,835 dated Sep. 25, 2017 in 17 pages.
Office Action received in U.S. Appl. No. 14/805,835 dated Jun. 12, 2018 in 16 pages.
Office Action received in U.S. Appl. No. 16/705,123 dated Mar. 21, 2022 in 26 pages.
Office Action received in U.S. Appl. No. 16/705,123 dated Jun. 9, 2021 in 15 pages.
Office Action received in U.S. Appl. No. 16/705,123 dated Sep. 22, 2021 in 10 pages.
Office Action received in U.S. Appl. No. 16/705,123 dated Mar. 16, 2022 in 11 pages.
Office Action received in Chinese Application No. CN 201380011120.5 dated Dec. 30, 2015.
Office Action received in Chinese Patent Application No. CN2018113531 dated Jul. 28, 2021, 6 pages.
Office Action received in Chinese Patent Application No. CN2018113531 dated Apr. 6, 2022, 9 pages.
International Search Report issued in application No. PCT/US2019/064644 dated Mar. 26, 2020.
Written Opinion issued in application No. PCT/US2019/064644 dated Mar. 26, 2020.
Supplemental European Search Report issued in EP Application No. 19892191 on Sep. 2, 2022.
Extended European Search Report issued in EP Application No. 19893625 on Sep. 2, 2022.
Office Action issued in JP Application No. 2021-532073 on Feb. 5, 2024.
Office Action issued in JP Application No. 2021-532070 on Dec. 25, 2023.
Office Action issued in CN Application No. 201980091428.2 on Dec. 26, 2023.
Office Action issued in KR Application No. 10-2021-7020119 on Feb. 27, 2024.

\* cited by examiner

SHIELDED INTEGRATED DEVICE PACKAGES

CROSS-REFERENCE TO RELATED APPLICATIONS

This application claims priority to U.S. Provisional Patent Application No. 62/776,340, filed Dec. 6, 2018, the entire contents of which are incorporated by reference herein in their entirety and for all purposes.

BACKGROUND

Field

The field relates to shielded integrated device packages.

Description of the Related Art

In various types of integrated device packages, electromagnetic radiation (e.g., X-rays) impinging upon an integrated device die may damage circuitry of the integrated device die. For example, in some medical imaging applications, such as X-ray imaging or computed tomography (CT) imaging, radiation can impinge upon the die and may damage or otherwise degrade the performance of the die. Accordingly, there is a continuing need for reducing or preventing damage to integrated device dies due to impinging electromagnetic radiation.

SUMMARY

In one embodiment, integrated device package is disclosed. The integrated device package can include a package substrate having a plurality of contact pads on a first side of the package substrate, the plurality of contact pads configured to electrically connect to a sensor assembly. The integrated device package can include a radiation shield attached to a second side of the package substrate by way of a first adhesive, the first side opposite the second side. The integrated device package can include an integrated device die attached to the radiation shield by way of a second adhesive. The integrated device die can include sensitive active electronic circuitry in a sensitive active region of the integrated device die, wherein the integrated device die is configured to process signals transmitted to the integrated device die from the sensor assembly by way of the contact pads, and wherein the integrated device die is configured to transmit the processed signals to an external device by way of the contact pads. A molding compound can be provided over the integrated device die and the radiation shield.

In another embodiment, an integrated device package is disclosed. The integrated device package can include a package substrate comprising an insulating substrate with conductive routing traces, the package substrate having a plurality of contact pads on a first side of the package substrate, the plurality of contact pads configured to electrically connect to a sensor assembly. The integrated device package can include a radiation shield attached to a second side of the package substrate by way of a first adhesive, the first side opposite the second side. The integrated device package can include an integrated device die attached to the radiation shield by way of a second adhesive, the integrated device die comprising sensitive active electronic circuitry in a sensitive active region of the integrated device die, wherein the integrated device die is configured to process signals transmitted to the integrated device die from the sensor assembly by way of the contact pads, and wherein the integrated device die is configured to transmit the processed signals to an external device by way of the contact pads.

In another embodiment, a sensor module is disclosed. The sensor module can include an integrated device package comprising an integrated device die and a radiation shield. The sensor module can include a sensor assembly comprising a sensor substrate and a sensor die mounted to a front side of the sensor substrate. The sensor module can include an electrical connector on a back side of the sensor substrate, the electrical connector configured to electrically connect to an external device, wherein the integrated device package is electrically connected to the electrical connector through the sensor substrate.

In another embodiment, an integrated device package is disclosed. The integrated device package can include a package substrate and an integrated device die mounted to the package substrate by way of a flip chip connection comprising a plurality of solder balls between the package substrate and the integrated device die. The integrated device package can include a radiation shield attached to the integrated device die by way of an adhesive.

BRIEF DESCRIPTION OF THE DRAWINGS

Embodiments of this disclosure will now be described, by way of non-limiting example, with reference to the accompanying drawings.

DETAILED DESCRIPTION

Various embodiments disclosed herein relate to a sensor module configured for use in imaging systems, such as in digital X-ray imaging systems, computed tomography (CT) imaging systems, ultrasound imaging systems, or any other suitable imaging system. For example, the shielding device and techniques disclosed herein can be arranged so as to prevent or block harmful electromagnetic radiation from reaching and damaging an integrated device die, such as an integrated circuit die having radiation-sensitive active processing circuitry. Various embodiments for shielding disclosed herein can also be used in other applications susceptible to radiation damage, such as aerospace applications for atmospheric radiation and bidirectional shielding.

Figure 1A:
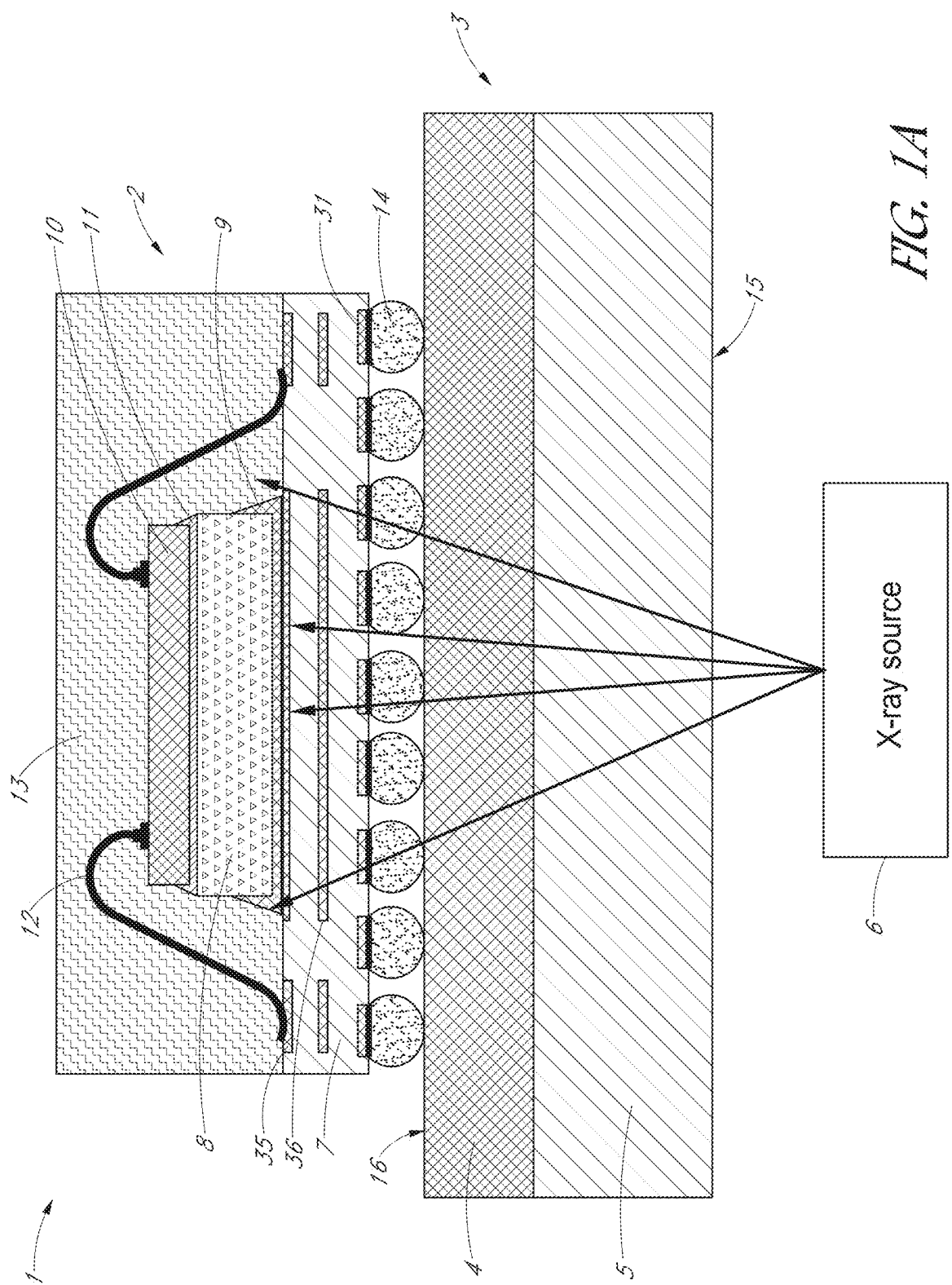
FIG. 1A is a schematic side sectional view of a sensor module according to one embodiment.

FIG. 1A is a schematic side sectional view of a sensor module 1 according to one embodiment. The sensor module 1 can comprise a sensor assembly 3 and an integrated device package 2 mounted to the sensor assembly 3. An illumination source 6, such as an X-ray source or any other suitable source of electromagnetic radiation can be provided and can direct electromagnetic radiation to a front side 15 of the sensor assembly 3. In various embodiments, although not shown herein, an object (such as a human patient, or any other suitable target object) can be provided between the illumination source 6 and the sensor assembly 3. Additional details regarding sensor assemblies and components provided therefor may be found throughout U.S. Pat. Nos. 8,829,454; 9,116,022; and 10,340,302, the entire contents of each of which are hereby incorporated by reference in their entirety and for all purposes.

The sensor assembly 3 can include a sensor substrate 4 and one or more sensor dies 5 mounted to a front side of the sensor substrate 4. The sensor substrate 4 can comprise any suitable type of substrate having a nonconductive or insulating base substrate with conductive routing traces (e.g., at least partially embedded traces), such as a laminate substrate, a printed circuit board (PCB) substrate, a semiconductor interposer, a flexible substrate comprising a polymer with embedded traces, or any other suitable substrate. The conductive routing traces can laterally and vertically transfer signals through the substrate 4 in various embodiments. The sensor die 5 can comprise a photodiode array (PDA) having a plurality of photosensitive elements that convert electromagnetic radiation to an electrical current. Although not shown, radiation modifiers, such as filters or scintillators, can be provided over the front side 15 of the sensor assembly 3. The sensor die 5 can accordingly transduce light impinging on the PDA into electrical signals which can be conveyed to conductive traces in the sensor substrate 4. In some embodiments, the sensor die 5 can be electrically connected to the sensor substrate 4 by way of a conductive adhesive, such as solder bumps, anisotropic conductive film (ACF), a conductive epoxy, etc.

An integrated device package 2 can be mounted to a back side 16 of the sensor assembly 3, e.g., to a back side or surface of the sensor substrate 4. In the illustrated embodiment, the package 2 can include a package substrate 7 having a first side or lower surface electrically and mechanically connected to the sensor substrate 4 by way of a conductive adhesive, e.g., by way of a plurality of solder balls 14 to provide electrical communication between contact pads (not shown) of the sensor substrate 4 and contact pads 31 of the package substrate 7. In addition, the package 2 can have a smaller lateral footprint than a corresponding lateral footprint of the sensor die 5. Beneficially, the relatively small lateral footprint of the package 2 can enable multiple die packages to be provided on the backside of the sensor module 1.

At least a portion of the electromagnetic radiation (e.g., X-rays) can pass through the sensor assembly 3 and the package substrate 7, and may damage electronic components of the package 2 if the radiation impinges on active or sensitive circuitry of the electronic components. Accordingly, various embodiments disclosed herein provide an electromagnetic shield 8 selected to prevent electromagnetic radiation (e.g., X-rays) from impinging on various electronic components of the package 2. The package substrate 7 can comprise a substrate having a nonconductive or insulating base substrate with conductive routing traces 36 (e.g., at least partially embedded traces), such as a laminate substrate, a printed circuit board (PCB) substrate, a semiconductor interposer, a flexible substrate comprising a polymer with embedded traces, or any other suitable substrate. The conductive routing traces 36 can laterally and vertically transfer signals through the package substrate 7 in various embodiments. For example, the traces 36 of the package substrate 7 can electrically connect the contact pads 31 on the first side of the package substrate 7 with corresponding bond pads 35 on the second side of the package substrate 7.

The shield 8 can be mounted to a second side or upper surface of the package substrate 7 by way of an adhesive 9. The adhesive 9 can include any suitable type of adhesive, e.g., a nonconductive (e.g., thermally nonconductive and/or electrically nonconductive) or conductive adhesive or epoxy. An integrated device die 10 can be mounted to an upper surface of the shield 8 by way of an adhesive 11, which may be the same as or different from the adhesive 9. Bond pads of the integrated device die 10 can electrically connect to corresponding contact pads at the upper surface of the package substrate 7 by way of one or more bonding wires 12. A molding compound 13 can be provided over the integrated device die 10, the bonding wires 12, the shield 8, and exposed portions of the package substrate 7 to encapsulate these components in the package 2.

The integrated device die 10 can comprise active processing circuitry configured to process electrical signals (e.g., analog signals) transduced by the sensor die 5 and transferred to the die 10 by way of the sensor substrate 4, the solder balls 14, conductive traces within the package substrate 7, and the bonding wires 12. The integrated device die 10 can process these signals in any suitable manner, including, for example, signal filtering, analog-to-digital conversion, etc. The signals processed by the integrated device die 10 can be transferred out of the package 10 to the larger electronic system to be rendered on a display or otherwise further processed in order to analyze the imaged object.

The electromagnetic shield 8 can be sized and comprise a material selected to as to effectively prevent damaging radiation (for example, X-rays) from impinging on active circuitry of the integrated device 10. In some embodiments, the shield 8 can be wider than the integrated device die 10, e.g., a lateral footprint of the shield 8 can be wider than a corresponding lateral footprint of the die 10, such that the die 10 lies within the shadow of the shield 8 relative to the illumination source 6, as shown in the embodiment of FIG. 1A. In other embodiments, the width of the die 10 may be the same as or larger than the width of the shield 8 (see FIG. 5). In such embodiments, the active circuitry in the die 10 may be disposed within the shadow of the shield 8 such that, even though portions of the die 10 may lie outside the footprint of the shield 8, the sensitive or active circuitry is disposed inside the lateral footprint of the shield 8.

The shield 8 can comprise any suitable type of shield that can effectively block or sufficiently limit damaging radiation (e.g., X-rays) from impinging on active circuitry of the die 10. The shield 8 can comprise a material and shape configured to block at least 75%, at least 85%, at least 90%, or at least 95% of X-ray radiation impinging on the sensor module 1. The shield 8 can comprise a material and shape configured to block 75% to 100% or 90% to 100% of the X-ray radiation impinging on the sensor module 1. For example, the shield 8 can comprise a metal having a density greater than 9 g/cm$^3$, greater than 10 g/cm$^3$, or greater than 15 g/cm$^3$. In some embodiments, the shield can comprise a metal having a density in a range of 9 g/cm$^3$ to 22 g/cm$^3$. In various embodiments, the shield 8 can comprise tungsten, lead, or molybdenum. A thickness of the shield 8 can be suitably selected based on the material composition of the shield 8. For example, a shield that has a higher percentage of a high density metal (e.g., tungsten) than another shield may be made thinner than the other shield formed of a lower percentage of the high density metal. In various embodiments, the thickness of the shield 8 can be at least 0.4 mm, or at least 0.5 mm, to provide adequate shielding for the die 10. For example, the thickness of the shield 8 can be in a range of 0.4 mm to 3 mm, in a range of 0.4 mm to 2 mm, in a range of 0.4 mm to 1.2 mm, in a range of 0.4 mm to 1 mm, in a range of 0.45 mm to 1 mm, in a range of 0.5 mm to 1 mm, in a range of 0.45 mm to 0.8 mm, in a range of 0.5 mm to 0.8 mm, in a range of 0.45 mm to 0.65 mm, or in a range of 0.7 mm to 0.9 mm.

The heights or thicknesses of the other components of the package 2 can be any suitable values. In various embodiments, a height of the molding compound can be in a range of 1 mm to 1.25 mm (e.g., about 1.140 mm in one embodiment). A thickness of the bonding wires 12 can be in a range of 15 μm to 40 μm (e.g., about 25.4 μm, or about 20 μm in various embodiments). A thickness of the integrated device die 10 may be in a range of 80 μm to 120 μm, or in a range of 90 μm to 110 μm (e.g., about 101.6 μm in various embodiments). Respective thicknesses of the adhesives 9, 11 can be in a range of 20 μm to 30 μm (e.g., about 25.4 μm in some embodiments). A thickness of the substrate 7 can be in a range of 300 m to 400 μm (e.g., about 360 μm in some embodiments). A height of the solder balls 14 can be in a range of 200 μm to 300 μm (e.g., about 240 μm in some embodiments). It should be appreciated that the heights and thicknesses provided above are merely examples and any suitable height or thickness may be suitable for a particular packaging arrangement.

Figure 1B:
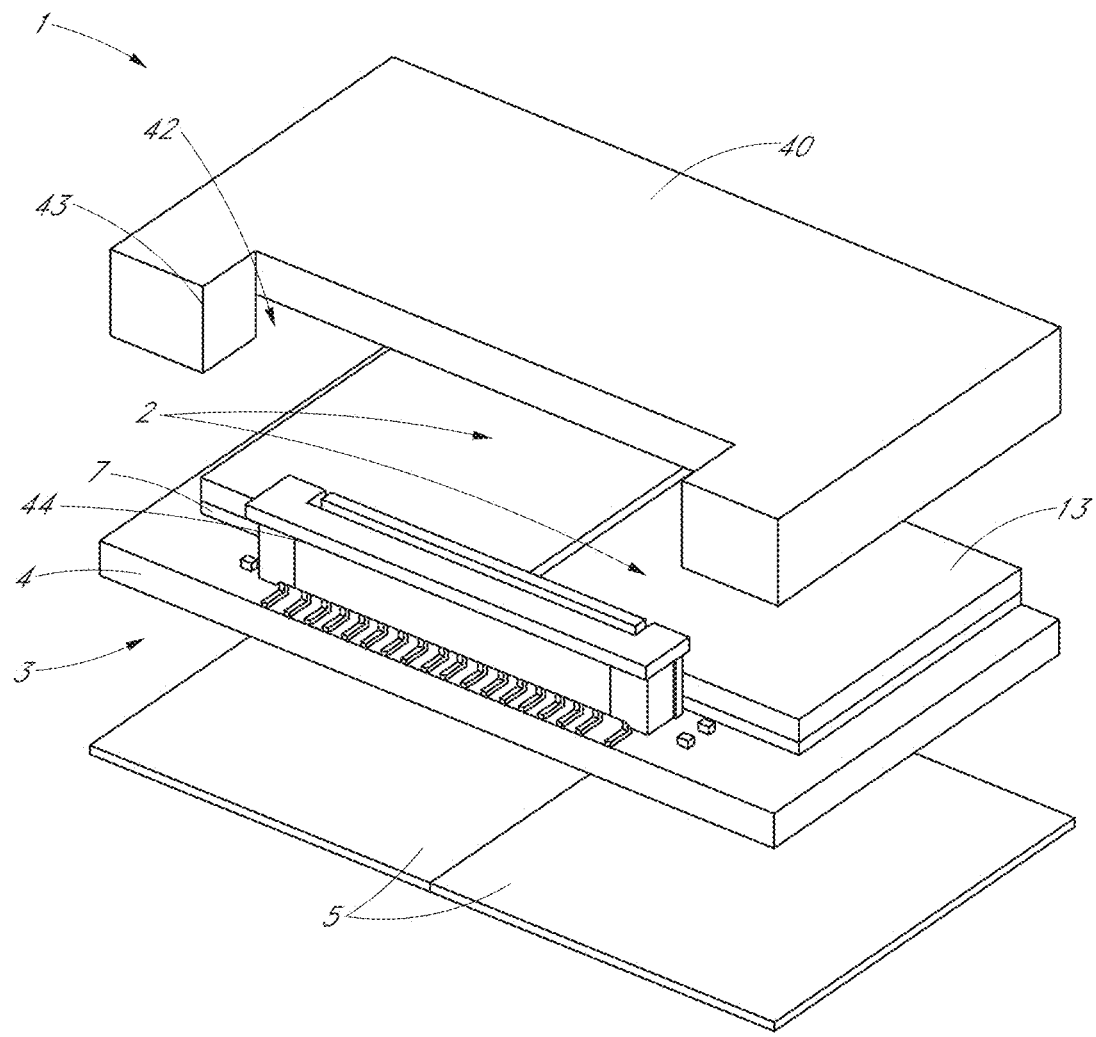
FIG. 1B is a schematic perspective view of a sensor module according to various embodiments.

FIG. 1B is a schematic perspective view of a sensor module 1 according to various embodiments. Unless otherwise noted, components of FIG. 1B may be the same as or generally similar to like-numbered components of FIG. 1A. For example, the sensor module 1 can comprise a sensor substrate 4. In FIG. 1B, a plurality (e.g., two) sensor dies 5 can be mounted to the sensor substrate 4. Any suitable number of sensor dies 5 can be mounted to the sensor substrate 4 (e.g., only one sensor die 5 on the sensor substrate 4, or more than two sensor dies 5 mounted on the substrate 4). In the embodiment of FIG. 1B, one or a plurality of integrated device packages 2 can be mounted to a back side of the sensor substrate 4, for example, by way of solder balls or other conductive adhesive. Two packages 2 are shown in FIG. 1B in the form of BGA packages, but it should be appreciated that any suitable number of packages 2 may be mounted to the sensor substrate 4. The package(s) 2 can comprise any of the packages 2 disclosed herein. As explained herein, the package(s) 2 can comprise a radiation shield (such as radiation shield 8 of FIG. 1A) to prevent incident radiation from damaging the integrated device die(s) in the package(s) 2.

A heat spreader or heat sink 40 can be provided over the packages 2 to convey heat away from the packages 2 and other heat-generating components of the sensor module 1. The heat sink 40 can include a recess 42 along a side portion 43 of the heat sink 40. In the embodiment of FIG. 1B, an electrical connector 44 can be mounted and electrically connected to the back side of the sensor substrate 4. The connector 44 extends outwardly from the sensor substrate 4 through the recess 42 of the heat sink 40. In the illustrated embodiment, the connector 44 is mounted to the back side of the sensor substrate 4 laterally offset from the package(s) 2. The connector 44 can be configured to electrically connect to an external device or system. For example, the connector 44 can be readily connected, for example by hand and without tools, to a cable or other electrical interface to transmit and receive signals to and from the external device or system. Beneficially, the connector 44 can transmit and/or receive signals to or from the integrated device package(s) 2. In some embodiments, the connector 44 may additionally or alternatively transmit and/or receive signals to or from the sensor die(s) 5. Utilizing a separate connector 44 mounted to the sensor substrate 4 can obviate the use of through mold vias (TMVs) or other connectors on or within the package(s) 2. The connector 44 can accordingly provide a common electrical input/output (I/O) interface for electrical communication between the external device or system and the integrated device package(s) 2 (and the sensor dies 5).

Thus, in FIG. 1B, the integrated device die 10 can be configured to process signals transmitted to the integrated device die 10 from the sensor assembly 3 by way of the contact pads 31 on the first side of the package substrate 7. The integrated device die 10 can be configured to transmit the processed signals to an external device by way of the contact pads 31 on the first side, which is opposite to the second side on which the shield 8 is mounted. In some embodiments, no electrical connectors (e.g., no TMVs) extend from the package substrate 7 through the molding compound 13 to an exterior surface of the molding compound 13, and instead such connections can be made through the sensor substrate 4.

Figure 2:
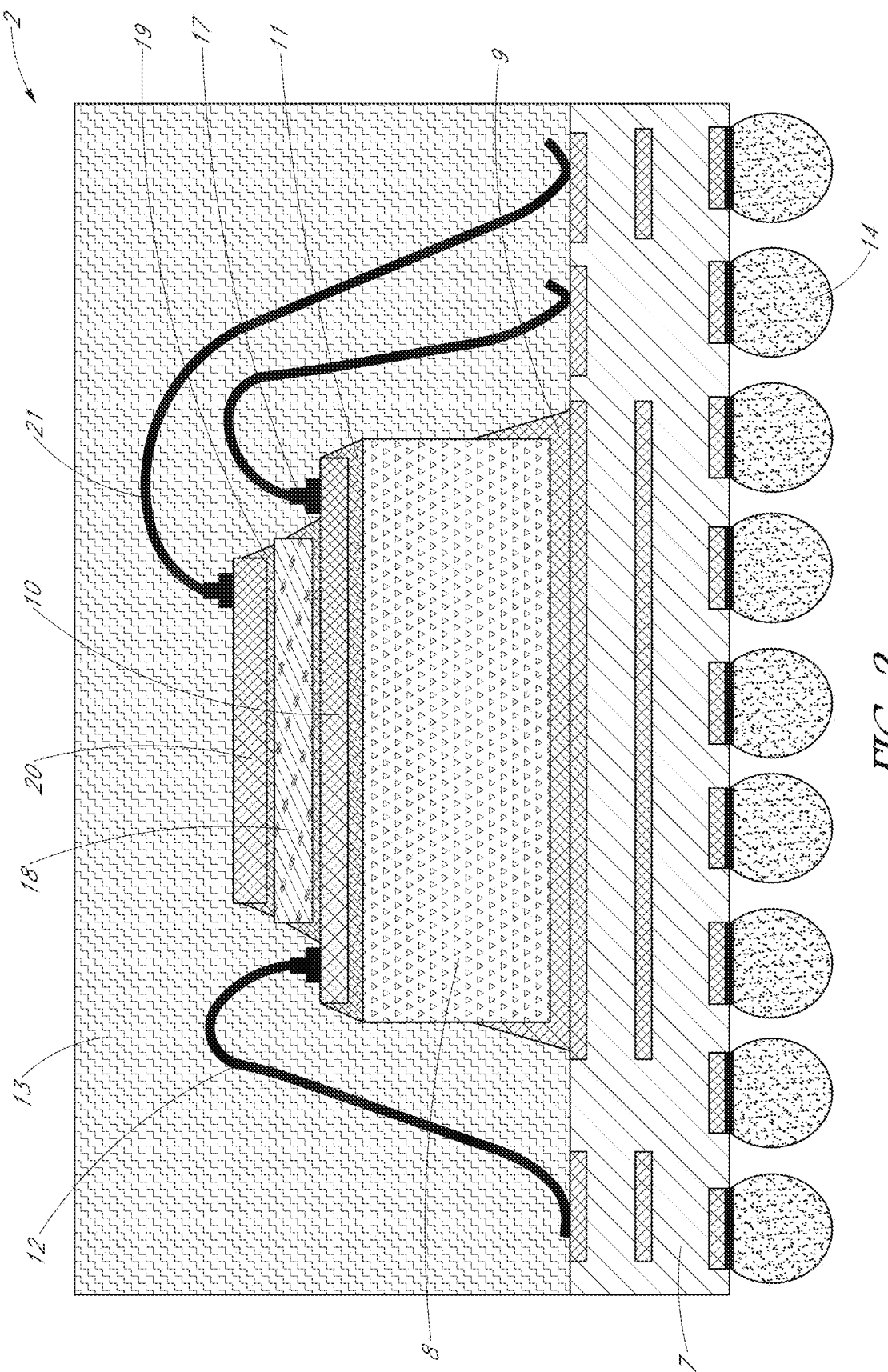
FIG. 2 is a schematic side sectional view of an integrated device package, according to various embodiments.

FIG. 2 is a schematic side sectional view of an integrated device package 2, according to another embodiment. Unless otherwise noted, components of FIG. 2 may be the same as or generally similar to like-numbered components of FIGS. 1A-1B. For example, as with the embodiment of FIG. 1A, the package 2 of FIG. 2 can comprise the shield 8 mounted to the package substrate 7 by way of adhesive 9. The integrated device die 10 can be mounted to the shield 8 by way of adhesive 11. Unlike the embodiment of FIG. 1A, however, in the embodiment of FIG. 2, an element comprising a spacer 18 can be adhered to the integrated device die 10 with an adhesive 17. An element 20 can be mounted to the spacer 18 with an adhesive 19. In the illustrated embodiment, the element 20 can comprise a second integrated device die configured to process additional signals transduced by the sensor assembly, and transferred to the element 20 by way of bonding wires 21. In the illustrated embodiment, the element 20 can have a width or lateral footprint less than a width or lateral footprint of the integrated device die 10. Further, the element 20 can have a width or lateral footprint less than a width or lateral footprint of the spacer 18.

In other embodiments, however, the element 20 can comprise a second electromagnetic radiation shield that may function generally similar to the shield 8. In such embodiments, the bonding wires 21 may be omitted. As with the shield 8, when the element 20 comprises a second shield, the element 20 can be wider than active circuitry in the integrated device die 10 (or in the spacer 18 in the event the spacer 18 comprises an integrated circuit die), such that the active circuitry (whether in the die 10 or spacer 18) lies within the shadow of the shield element 20. Beneficially, the use of the element 20 as a radiation shield can provide bidirectional shielding capabilities so as to protect the integrated device die 10 (or spacer 18) from damaging electromagnetic radiation.

The spacer 18 can include any suitable type of component that vertically spaces the element 20 above the die 10 and that is adhered to the die 20 with an adhesive. The spacer 18 can vertically space the upper loop of the bonding wires 21 to be above the upper loop of the bonding wires 12 below the wires 21 so as to prevent the wires 21 from contacting and shorting the wires 12, or vice versa. In some embodiments, the spacer 18 can comprise an inorganic substrate, such as a dummy block of semiconductor material (e.g., silicon) with no active circuitry patterned therein. In other embodiments, the spacer 18 can comprise active circuitry for providing additional processing capabilities for the package 2. The spacer 18 can have any suitable thickness. In various embodiments, the thickness of the spacer 18 can be in a range of 100 μm to 200 μm (e.g., about 152.4 μm in some embodiments).

Figure 3:
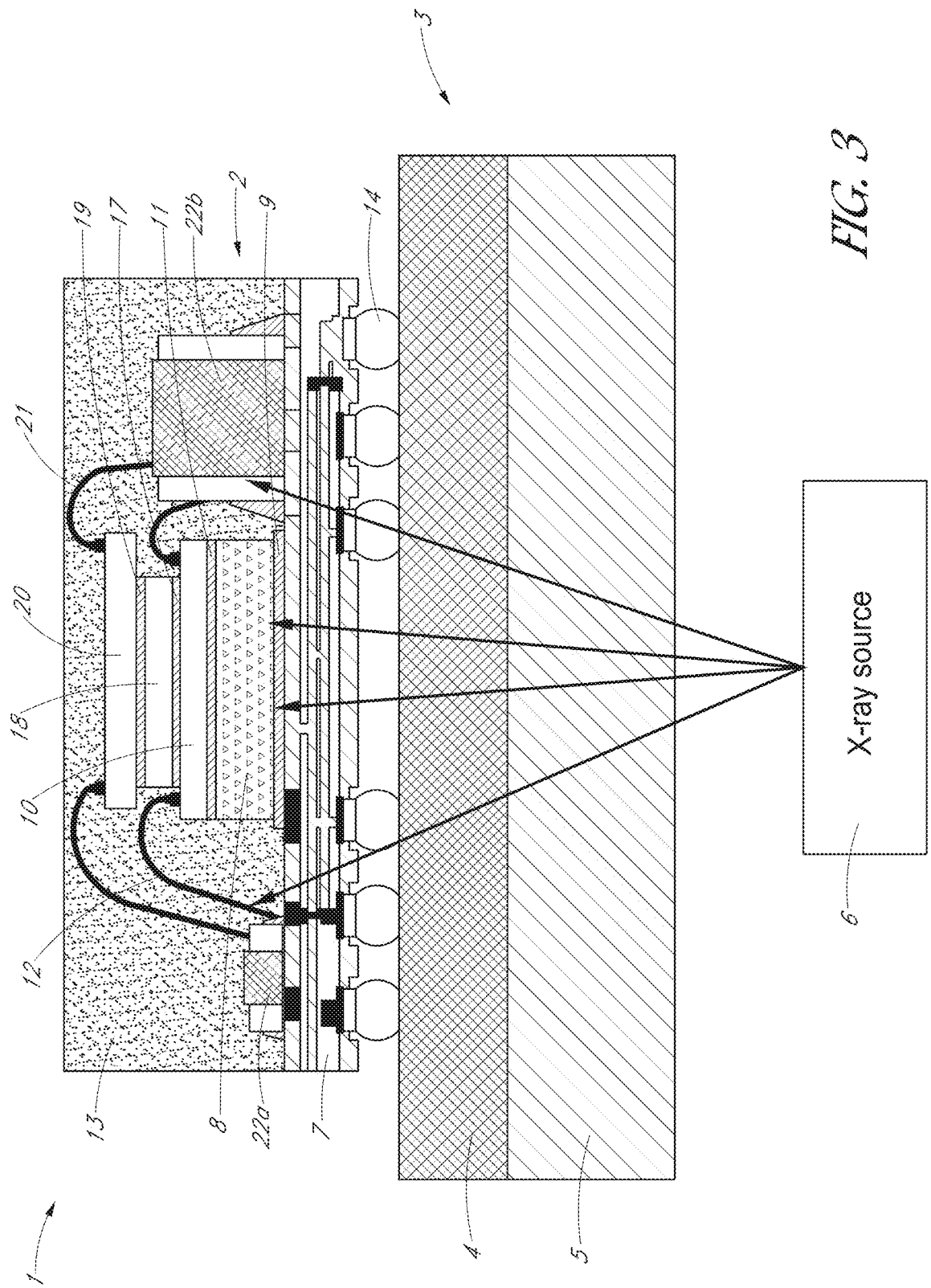
FIG. 3 is a schematic side sectional view of a sensor module in accordance with various embodiments.

FIG. 3 is a schematic side sectional view of a sensor module 1 in accordance with various embodiments. As in FIG. 1A, the sensor module 1 can include a sensor assembly 3 and an integrated device package 2 mounted to the sensor module 3. Unless otherwise noted, components of FIG. 3 may be the same as or generally similar to like-numbered components of FIGS. 1A-2. For example, the package 2 of FIG. 3 may be generally similar to the package 2 of FIG. 2. As with FIG. 2, in FIG. 3, the spacer 18 is attached to the integrated device die 10 with adhesive 17, and the element 20 is attached to the spacer 18 with adhesive 19. Unlike the embodiment of FIG. 2, however, the element 20 is wider than the spacer 18. As explained above, the element 20 can be wider than, the same width as, or narrower than the integrated device die 10. In the illustrated embodiment, the element 20 comprises a second integrated device die. As explained above, in other embodiments, the element 20 can comprise a second radiation shield. Further, as shown in FIG. 3, the package 2 can comprise passive devices 22a, 22b (e.g., capacitors, inductors, resistors, etc.) mounted to the package substrate 7 with respective adhesives adjacent to the shield 8. In FIG. 3, the passive devices 22a, 22b may not be shielded, for example, in arrangements in which the passive devices 22a, 22b may not be sensitive to the impinging electromagnetic radiation.

Figure 4:
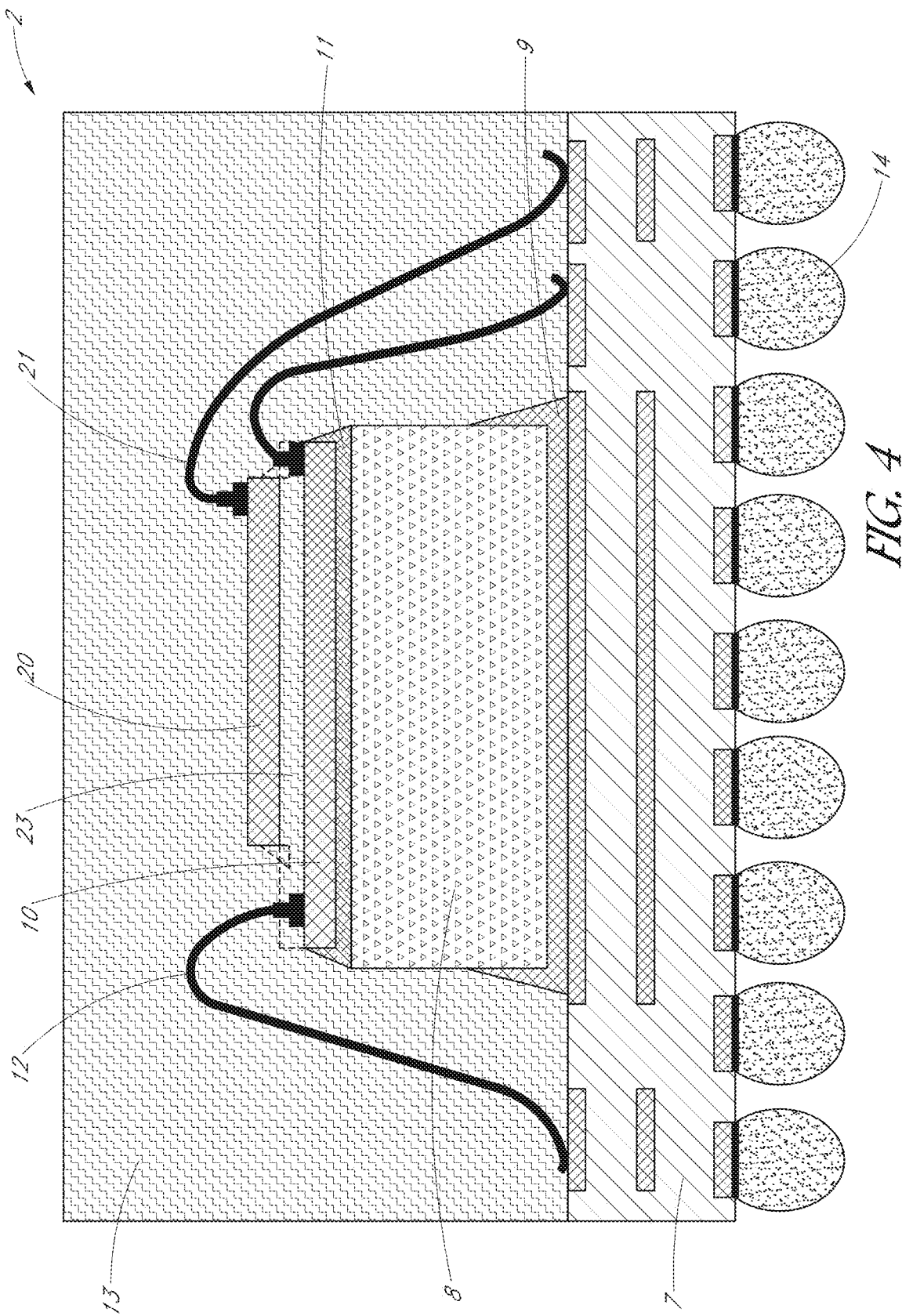
FIG. 4 is a schematic side sectional view of an integrated device package according to various embodiments.

FIG. 4 is a schematic side sectional view of an integrated device package 2 according to various embodiments. Unless otherwise noted, components of FIG. 4 may be the same as or generally similar to like-numbered components of FIGS. 1A to 3. For example, as with FIGS. 1A-3, the shield 8 can be attached to the package substrate 7 by way of adhesive 9. The integrated device die 10 can be attached to the shield 8 by way of adhesive 11. Unlike FIGS. 1A to 3, however, in FIG. 4, the element 20 can be mounted over the integrated device die 10 by way of an intervening mounting structure 23. As explained above, the element 20 can comprise a second integrated device die in the illustrated embodiment. In other embodiments, the element 20 can comprise a second radiation shield. The mounting structure 23 can comprise a film-on-wire (FOW) structure in which a film (e.g., a die attach film or material) can be deposited, printed (e.g., screen printed), laminated, or applied over the upper surface of the die 10 (which may comprise an active surface in some embodiments) as well as over portions of the bonding wires 12 and/or the bond pads of the die 10 to which the wires 12 connect. In other embodiments, the film can be spread as a paste or epoxy. The film can comprise a material that has a flowable state and a cured state in which the film can be cured or hardened after being flowed over the die 10. In some embodiments, the film can comprise an inorganic dielectric or polymer. The mounting structure 23 can serve to provide a vertically raised, mechanical attachment support for the element 20. For embodiments in which the element 20 is connected to the substrate 7 by bonding wires 21, the mounting structure 23 can vertically raise the bonding wires 21 above the wires 12 to prevent shorting.

Figure 5:
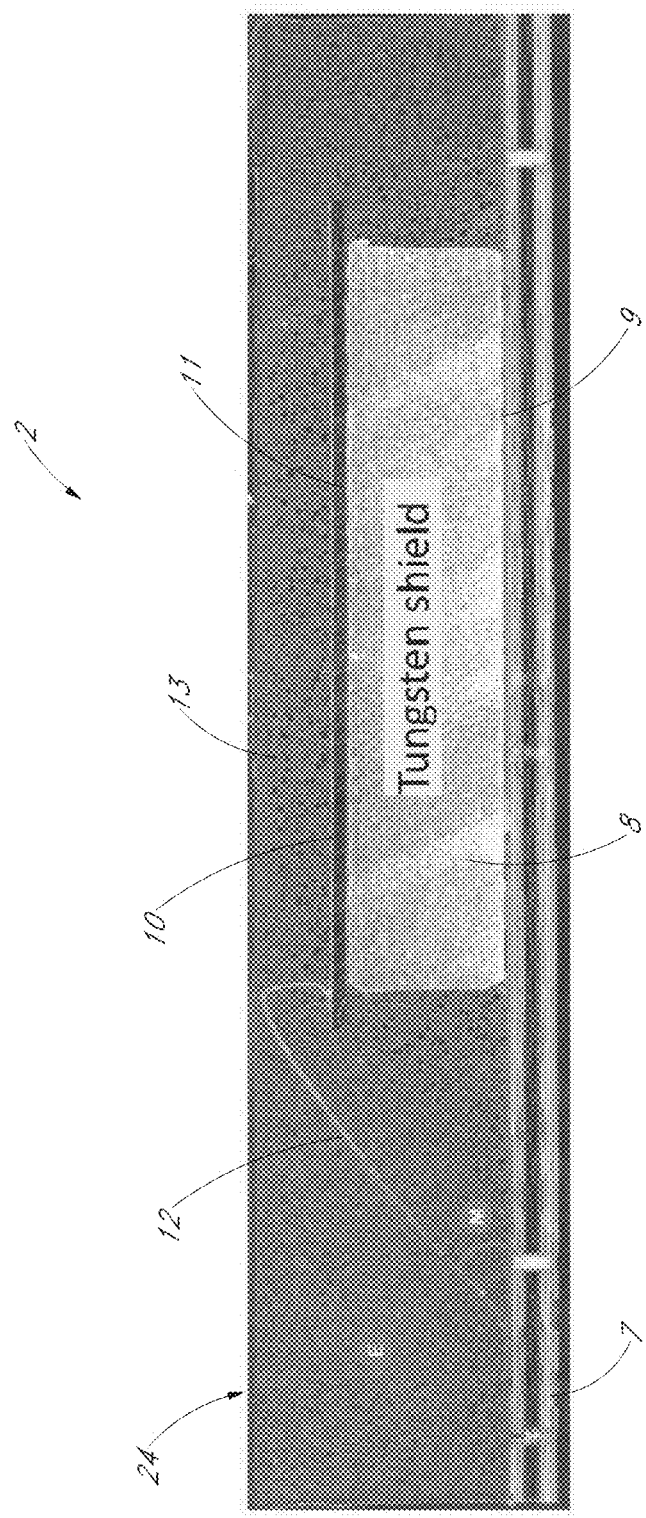
FIG. 5 is a micrograph illustrating an example integrated device package, similar to the package shown in FIG. 1A.

FIG. 5 is a micrograph illustrating an example integrated device package 2, similar to the package 2 shown in FIG. 1A. Unless otherwise noted, components of FIG. 5 may be the same as or generally similar to like-numbered components of FIGS. 1A-4. In the illustrated example, the shield 8 comprises a tungsten shield that is substantially thicker than the die 10. As explained above, however, the thickness of the shield 8 can be selected based on the material properties of the particular shield to be used and/or the expected radiation dose. As shown, a height E and an angle M of the bonding wire 12 can be selected so as to be adequately spaced below an upper surface 24 of the molding compound 13, such that the bonding wires 12 are adequately embedded within the molding compound 13 and not exposed through the molding compound 13. In some embodiments, for example, the height E can be at least 40 μm shorter than the molding compound 13, or at least 50 μm shorter than the molding compound 13, e.g., in a range of 40 μm to 80 μm shorter than the molding compound 13, or in a range of 50 μm to 70 μm shorter than the molding compound 13.

In the illustrated embodiment, the lateral footprint of the shield 8 is smaller than a lateral footprint of the die 10. To shield electronic circuitry in the die 10, the shield 8 can have a lateral footprint larger than an active region of the die 10 in which the active circuitry is located. In some embodiments, some non-sensitive circuitry (e.g., passive electronic components, or active circuitry that is not changed, damaged or otherwise negatively affected by the incident radiation) may be disposed outside the lateral footprint of the shield 8, but sensitive active circuitry (e.g., circuitry that is physically or electrically sensitive to, or that is at risk of being damaged by, the incident electromagnetic radiation) may be disposed in a sensitive active region within the lateral footprint of the shield 8. In other embodiments, as explained above, the lateral footprint of the shield 8 can be larger than the lateral footprint of the die 10.

Figure 6:
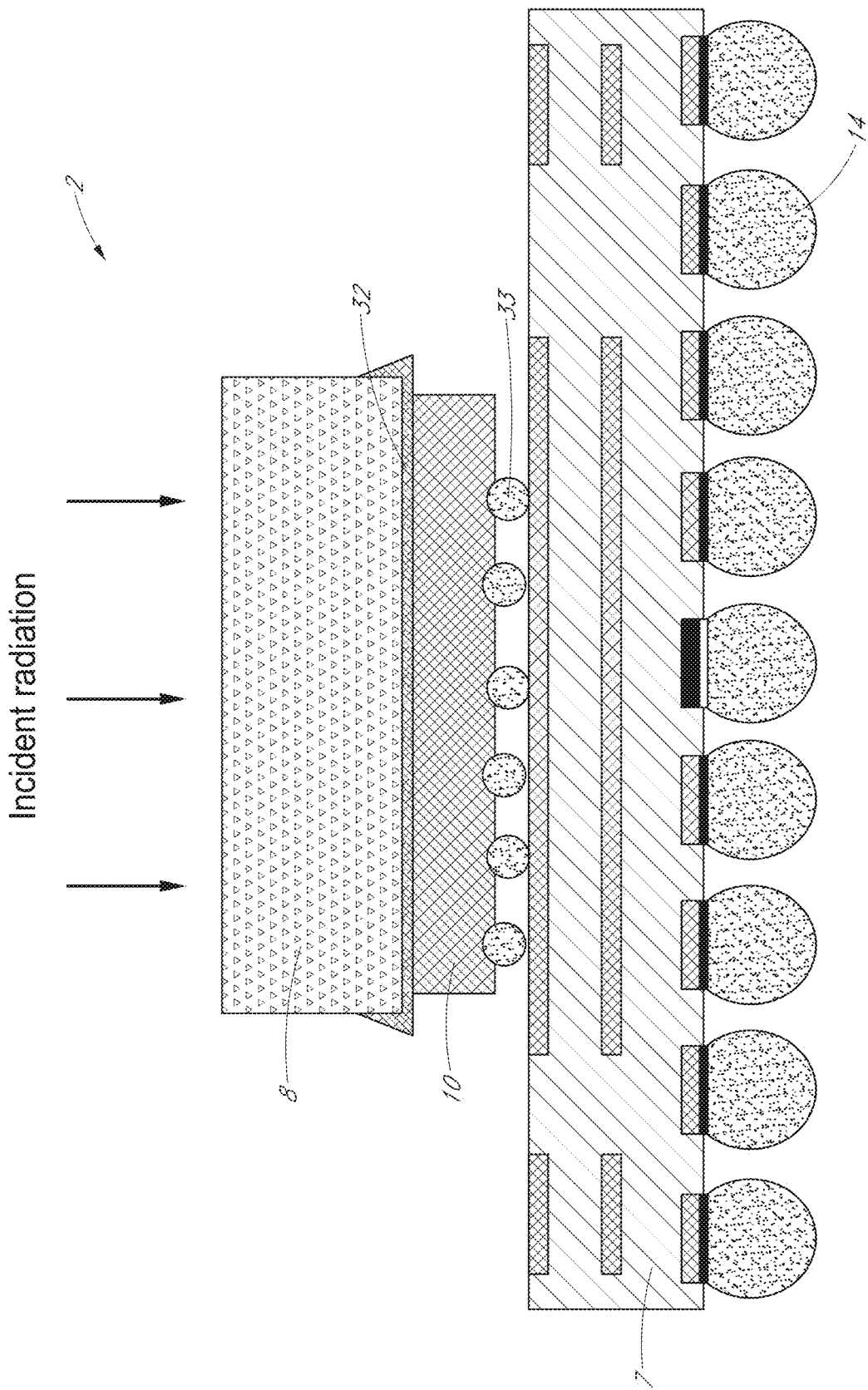
FIG. 6 is a schematic side sectional view of an integrated device package, according to another embodiment.

FIG. 6 is a schematic side sectional view of an integrated device package 2, according to another embodiment. Unless otherwise noted, components of FIG. 6 may be the same as or generally similar to like-numbered components of FIGS. 1A-5. Unlike the embodiments illustrated in FIGS. 1A-5, in FIG. 6, the integrated device die 10 can be physically and electrically connected to the front side of the package substrate 7 by an adhesive. In the embodiment of FIG. 6, for example, the die 10 can be connected to the package substrate 7 with a conductive adhesive in a flip chip arrangement by way of a plurality of solder balls 33. Thus, in FIG. 6, contact pads of the die 10 can be disposed facing the package substrate 7. In some embodiments, active circuitry of the die 10 can be disposed facing the package substrate 7. In other embodiments, active circuitry can be on the side of the die 10 facing away from the package substrate 7, and through vias can be provided to connect to the contact pads of the die 10.

In FIG. 6, the shield 8 can be mounted to the die 10 by way of an adhesive 32, which can comprise a conductive or non-conductive adhesive. In the illustrated embodiment, there may be no molding compound over the die 10 and shield 8. In other embodiments, however, a molding compound similar to the molding compound 13 of FIGS. 1A-5 can be provided over the shield 8, die 10, and exposed portions of the front side of the package substrate 7. In other embodiments, the package 2 can include a package lid mounted to the substrate 7 to define a cavity package, as explained below in connection with FIGS. 7-10. In some embodiments, the package 2 can be arranged over a sensor assembly in a manner similar to that shown in FIG. 1A. In such embodiments, in which incident radiation impinges upwardly as shown in FIG. 1A, the die 10 of FIG. 6 may be unshielded. In other embodiments, however, the package 2 can be arranged relative to a mounting structure (such as a system board or other structure), such that incident radiation impinges downwardly as shown in FIG. 6. In such embodiments, the shield 8 may intervene between the flip-chip mounted die 10 and the radiation source to protect the flip-chip mounted die 10 from damaging radiation.

Figure 7:
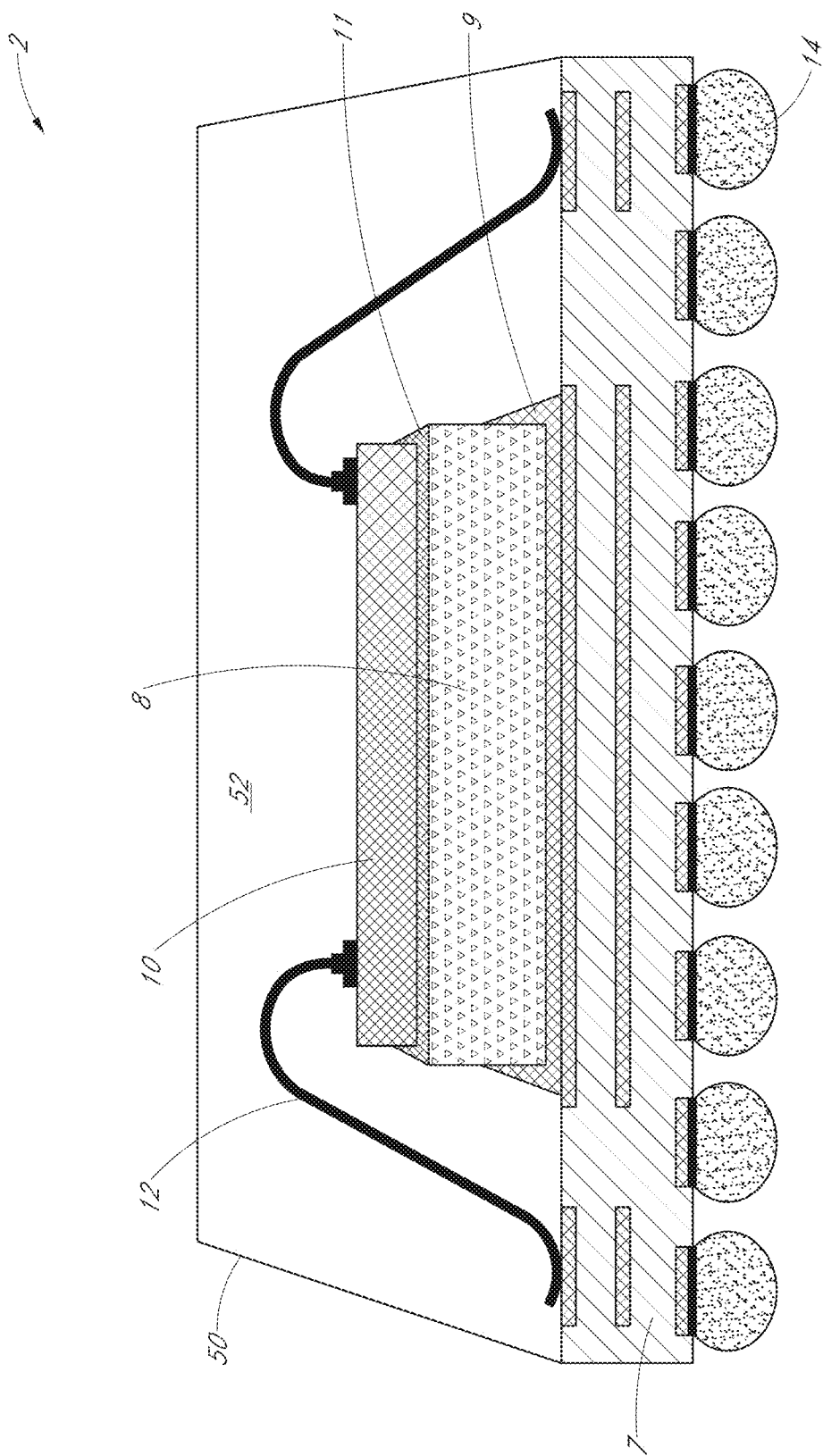
FIG. 7 is a schematic side sectional view of an integrated device package comprising a package lid mounted to a package substrate to define a cavity package.

FIG. 7 is a schematic side sectional view of an integrated device package 2 comprising a package lid 50 mounted to the package substrate 7 to define a cavity package. Unless otherwise noted, the components of FIG. 7 may be the same as or generally similar to like-numbered components of FIGS. 1A-6. Unlike the embodiments shown in FIGS. 1A-5, in FIG. 7, the package lid 50 can be mounted (e.g., adhered) to the upper surface of the package substrate 7 to define a cavity 52 in which the radiation shield 8 and integrated device die 10 are disposed. In the embodiment of FIG. 7, the radiation shield 8 is mounted to the upper surface of the package substrate 7 using an adhesive 9. The integrated device die 10 can be mounted to the upper surface of the shield 8 using an adhesive 11. The die 10 can be wire bonded to the substrate 7 using the bonding wires 12. In some embodiments, the package lid 50 can comprise a metallic material or a plastic material coated with metal to further shield the integrated device die 10 from incident radiation. For example, a thickness of the package lid 50 can be selected so as to effectively shield the die 10 from various types of incident radiation. In some embodiments, the lid 50 can be electrically grounded.

Figure 8:
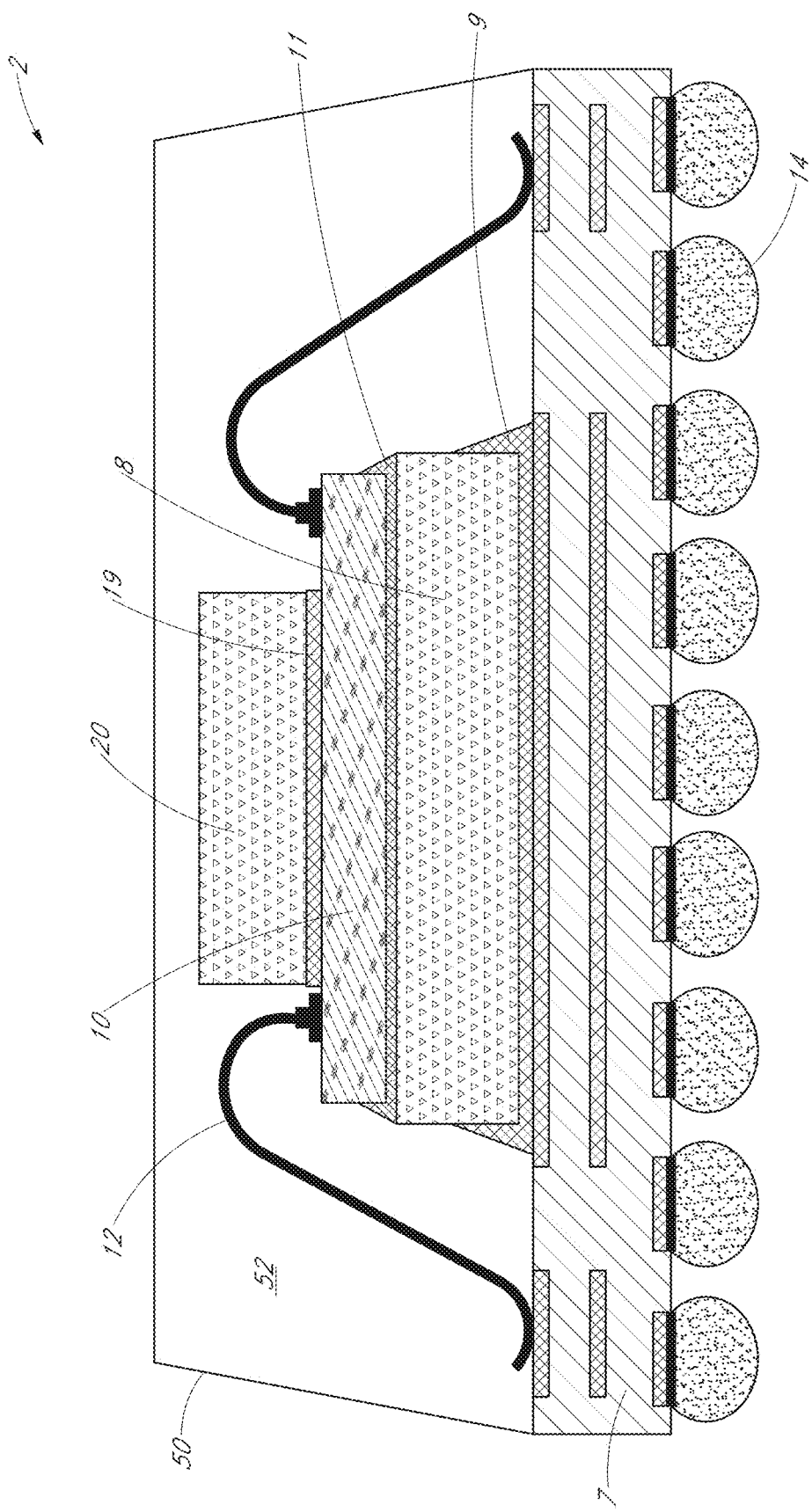
FIG. 8 is a schematic side sectional view of an integrated device package comprising a cavity package according to another embodiment.

FIG. 8 is a schematic side sectional view of an integrated device package 2 comprising a cavity package according to another embodiment. Unless otherwise noted, the components of FIG. 8 may be the same as or generally similar to like-numbered components of FIG. 7. Unlike FIG. 7, in the embodiment of FIG. 8, an element 20 is mounted over the integrated device die 10 by an adhesive 19 such that the die 10 is disposed between the element 20 and the radiation shield 8. As explained above in connection with FIG. 2, the element 20 can comprise an additional integrated device die in some embodiments. In the illustrated embodiment, however, the element 20 comprises an additional radiation shield which may be similar to the radiation shield 8. The element 20 can accordingly be positioned to shield the upper side of the integrated device die 10. Thus, in FIG. 8, both the lower and upper sides of the die 10 may be shielded from incident radiation. In the illustrated embodiment, the element 20 may have a lateral footprint smaller than a corresponding lateral footprint of the die 10 so that the element 20 can be disposed between the bonding wires 12. However, the element 20 may have a sufficiently large lateral footprint so as to cover and shield sensitive circuitry of the underlying die 10. Although the package 2 of FIG. 8 is shown as a cavity package, in other embodiments, the shields and die can be overmolded with a molding compound. Thus, the die 10 can be protected from radiation damage from both major surfaces.

Figure 9:
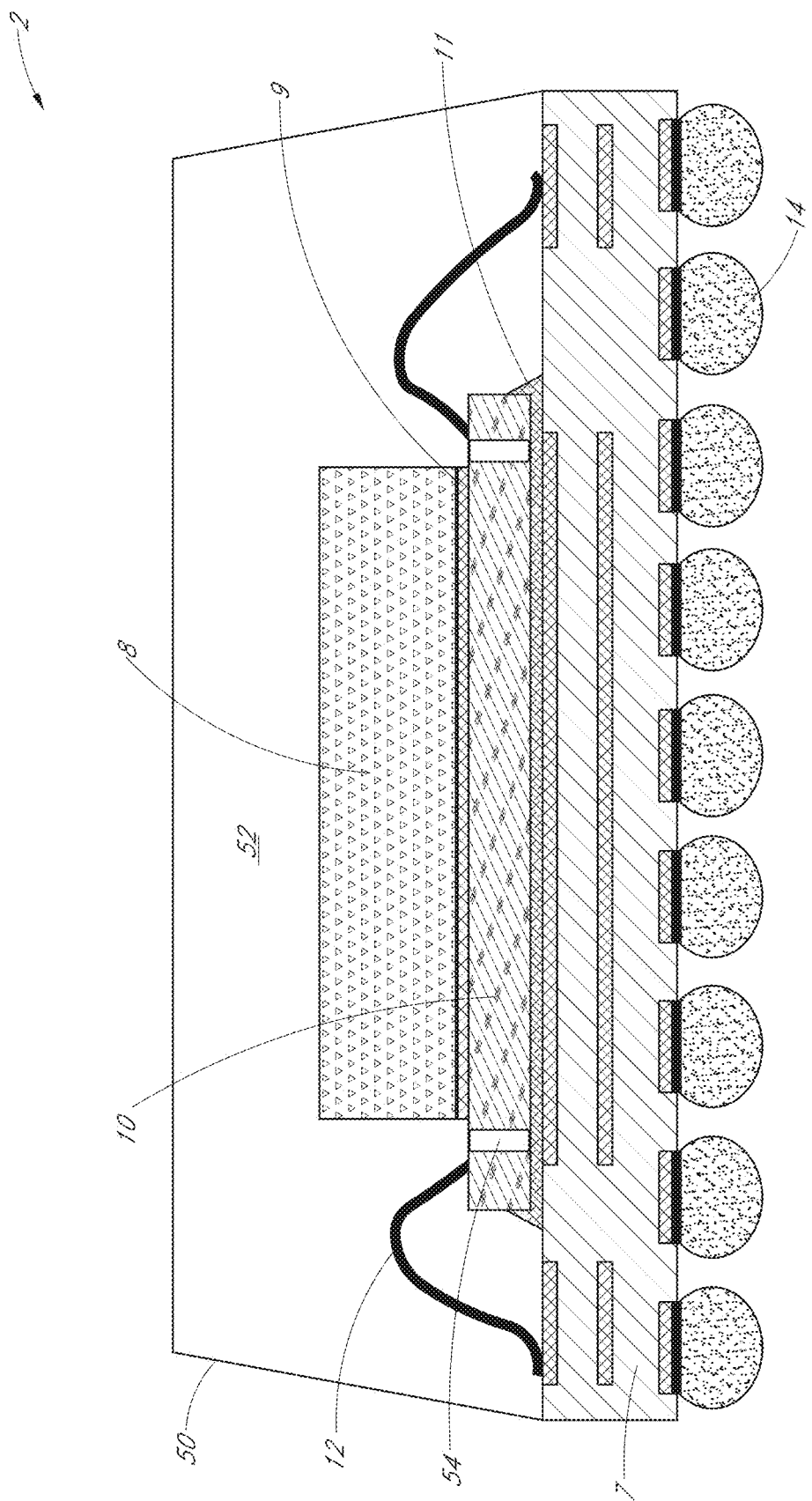
FIG. 9 is a schematic side sectional view of an integrated device package comprising a cavity package with a radiation shield on top of an integrated device die.

FIG. 9 is a schematic side sectional view of an integrated device package 2 comprising a cavity package with the radiation shield 8 on top of the integrated device die 10. Unless otherwise noted, the components of FIG. 9 may be the same as or generally similar to like-numbered components of FIGS. 1A-8. In FIG. 9, however, the die 10 is mounted to the package substrate 7 by way of the adhesive 11, and the radiation shield 8 is mounted over the upper surface of the die 10 by way of the adhesive 9. In some embodiments, the die 10 can have active circuitry on both the upper and lower surfaces of the die 10. In such arrangements, the die 10 may be flip chip mounted to the package substrate 7 by way of solder balls, in which case the adhesive 11 may comprise an underfill material. Thus, the radiation shield 8 can be positioned to shield the die 10 from incident radiation impinging on the upper surface of the die 10. In the illustrated embodiment, the shield 8 can have a lateral footprint smaller than the lateral footprint of the die 10. As shown, the shield 8 can be positioned between bonding wires 12. Through substrate vias 54 can also be provided to provide electrical communication between the lower and upper surfaces of the die 10. Although the package 2 of FIG. 9 is shown as a cavity package, in other embodiments, the shield and die can be overmolded with a molding compound.

Figure 10:
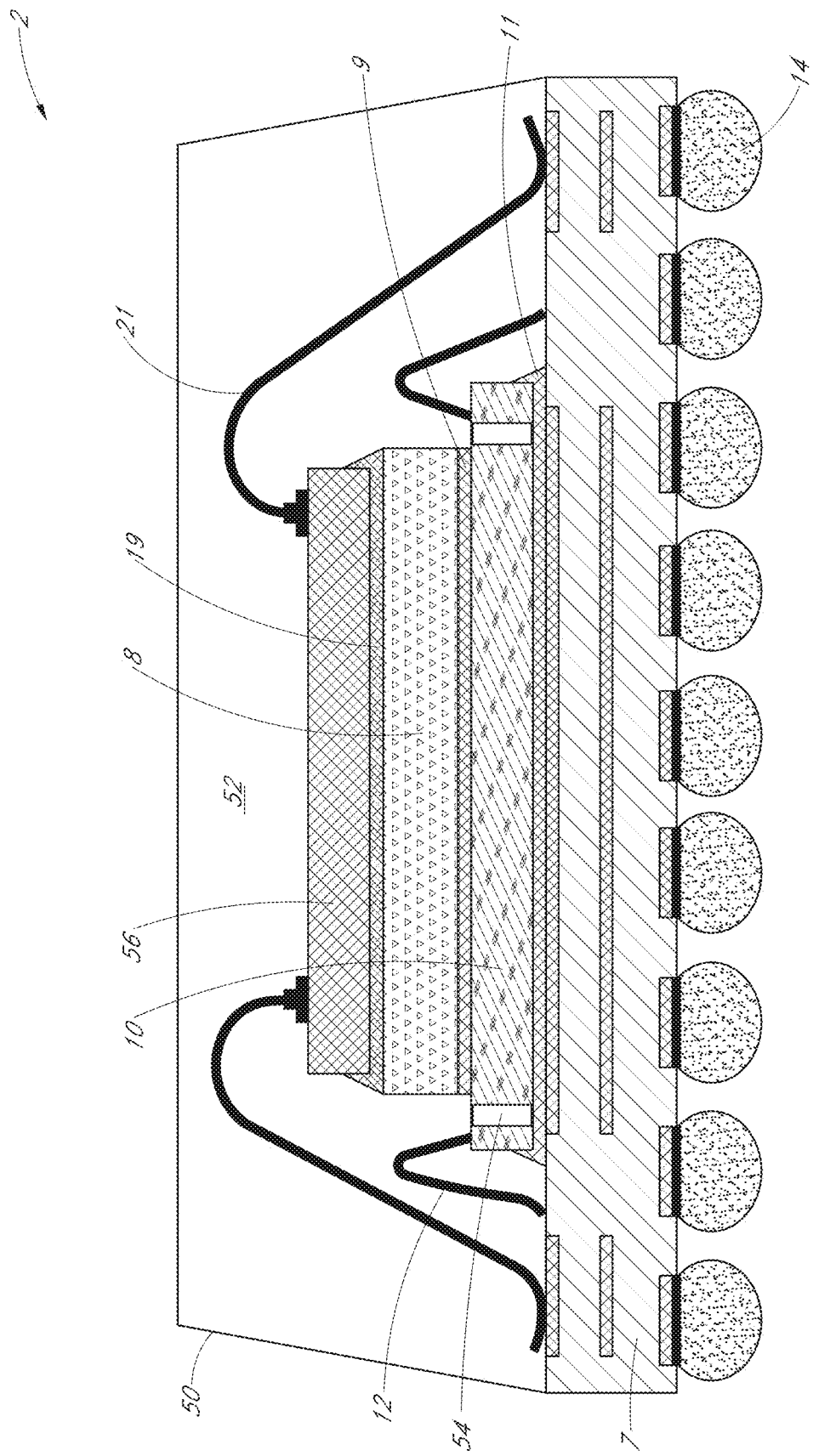
FIG. 10 is a schematic side sectional view of an integrated device package comprising a cavity package with a radiation shield disposed between two integrated device dies.

FIG. 10 is a schematic side sectional view of an integrated device package comprising a cavity package with a radiation shield disposed between two integrated device dies. Unless otherwise noted, the components of FIG. 10 may be the same as or generally similar to like-numbered components of FIG. 9. Unlike the embodiment of FIG. 9, in FIG. 10, a second integrated device die 56 (which may be similar in functionality to the die 10) may be mounted over the radiation shield 8 by way of the adhesive 19. The shield 8 can serve as a spacer to position the second die 56 above the die 10 such that the bonding wires 21 do not contact the bonding wires 12. Although not shown, in some embodiments, an additional radiation shield can also be provided over the upper surface of the second die 56 such that both surfaces of the second die 56 may be shielded. Although the package 2 of FIG. 10 is shown as a cavity package, in other embodiments, the shields and dies can be overmolded with a molding compound.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A sensor module comprising:
   an integrated device package comprising:
      a package substrate having a plurality of contact pads on a first side of the package substrate, the plurality of contact pads configured to electrically connect to a sensor substrate of the sensor module;
      a radiation shield attached to a second side of the package substrate by way of a first adhesive, the first side opposite the second side;
      an integrated device die attached to the radiation shield by way of a second adhesive, the integrated device die comprising sensitive active electronic circuitry in a sensitive active region of the integrated device die, wherein the integrated device die is configured to process signals transmitted to the integrated device die from the sensor substrate by way of the plurality of contact pads, and wherein the integrated device die is configured to transmit the processed signals to an external device by way of the plurality of contact pads; and a molding compound over the integrated device die and the radiation shield;

a heat spreader disposed over the integrated device package, the heat spreader configured to convey heat from components of the sensor module; and a connector mounted to the sensor substrate, the connector laterally offset from the integrated device package along the sensor substrate and extending outwardly from the sensor substrate in a direction towards the heat spreader, wherein, in operation of the sensor module, the processed signals are transferred between the integrated device die and the external device along an electrical pathway extending from the integrated device die, through the plurality of contact pads, to the sensor substrate, and from the sensor substrate to the external device through the connector mounted to the sensor substrate, without being transferred along a through-mold via (TMV); and wherein the heat spreader comprises a recess along a side portion of the heat spreader, the connector extending through the recess of the heat spreader.

2. The sensor module of claim 1, wherein the processed signals are transferred from the plurality of contact pads to the sensor substrate through solder.

3. The sensor module of claim 1, wherein the integrated device die is connected to the package substrate by one or more bonding wires.

4. The sensor module of claim 1, further comprising an element mounted to the integrated device die, the element comprising a second integrated device die.

5. The sensor module of claim 4, further comprising an element mounted to the integrated device die, wherein the element comprises a second radiation shield mounted to a spacer opposite the integrated device die, the radiation shield positioned to shield a first side of the integrated device die from electromagnetic radiation, the second radiation shield positioned to shield a second side of the integrated device die from electromagnetic radiation, the first side opposite the second side.

6. The sensor module of claim 1, further comprising a mounting structure over the integrated device die, the mounting structure comprising a film.

7. The sensor module of claim 1, wherein the package substrate comprises an insulating substrate with conductive routing traces, the conductive routing traces electrically connecting the plurality of contact pads with corresponding bond pads on the second side of the package substrate.

8. A sensor module comprising:
an integrated device package comprising:
  a package substrate comprising an insulating substrate with conductive routing traces, the package substrate having a plurality of contact pads on a first side of the package substrate, the plurality of contact pads configured to electrically connect to a sensor substrate of the sensor module;
  a radiation shield attached to a second side of the package substrate by way of a first adhesive, the first side opposite the second side; and
  an integrated device die attached to the radiation shield by way of a second adhesive, the integrated device die comprising sensitive active electronic circuitry in a sensitive active region of the integrated device die, wherein the integrated device die is configured to process signals transmitted to the integrated device die from the sensor substrate by way of the plurality of contact pads, and wherein the integrated device die is configured to transmit the processed signals to an external device by way of the plurality of contact pads;

a heat spreader disposed over the integrated device package, the heat spreader configured to convey heat from components of the sensor module; and a connector mounted to the sensor substrate, the connector laterally offset from the integrated device package along the sensor substrate and extending outwardly from the sensor substrate in a direction towards the heat spreader, wherein the sensor module is configured such that all processed signals that are transferred between the integrated device die and the external device are transferred along an electrical pathway extending from the integrated device die, through the plurality of contact pads, to the sensor substrate, and from the sensor substrate to the external device through the connector mounted to the sensor substrate; and wherein the heat spreader comprises a recess along a side portion of the heat spreader, the connector extending through the recess of the heat spreader.

9. The sensor module of claim 8, further comprising a molding compound over the integrated device die and the radiation shield.

10. The sensor module of claim 8, further comprising a package lid mounted to the package substrate to define a cavity in which the integrated device die and the radiation shield are disposed.

11. The sensor module of claim 8, further comprising an element mounted to the integrated device die.

12. The sensor module of claim 11, wherein the element comprises a second radiation shield.

13. The sensor module of claim 11, wherein the element comprises a second integrated device die.

14. The sensor module of claim 11, wherein the element comprises a spacer, the sensor module further comprising a second integrated device die mounted to the spacer.

15. A sensor module comprising:
an integrated device package comprising an integrated device die and a radiation shield;
a sensor assembly comprising a sensor substrate and a sensor die mounted to a front side of the sensor substrate;
a heat spreader disposed over the integrated device package, the heat spreader configured to convey heat from components of the sensor module; and
an electrical connector on a back side of the sensor substrate, the electrical connector configured to electrically connect to an external device, wherein the integrated device package is electrically connected to the electrical connector through the sensor substrate; and
wherein the electrical connector is laterally offset from the integrated device package along the sensor substrate and extending outwardly from the sensor substrate in a direction towards the heat spreader, and
wherein, during operation of the sensor module, signals are transferred between the integrated device package and the external device along an electrical pathway extending from the integrated device die to the sensor substrate, and from the sensor substrate to the external device through the electrical connector on the back side of the sensor substrate; and wherein the heat spreader comprises a recess along a side portion of the heat spreader, the electrical connector extending through the recess of the heat spreader.

16. The sensor module of claim 15, wherein the integrated device package comprises a package substrate having a first side and a second side opposite the first side, the integrated device die and radiation shield disposed on the second side of the package substrate, wherein contact pads on the first side of the package substrate are physically and electrically connected to contact pads on a back side of the sensor substrate.

17. The sensor module of claim 16, wherein the integrated device die is wire bonded to the package substrate by bonding wires.

18. The sensor module of claim 16, wherein the integrated device die is mounted to the first side of the package substrate by way of a flip chip connection, and wherein the radiation shield is attached to the integrated device die by way of an adhesive.

19. The sensor module of claim 15, wherein, during operation of the sensor module, the signals are transferred from the integrated device package to the sensor substrate through solder balls.

20. The sensor module of claim 16, further comprising a package lid mounted to the package substrate to define a cavity in which the integrated device die and the radiation shield are disposed.

* * * * *